(12) United States Patent
Wang et al.

(10) Patent No.: US 8,963,270 B2
(45) Date of Patent: Feb. 24, 2015

(54) FABRICATION OF INTERCONNECTED THIN-FILM CONCENTRATOR CELLS USING SHADOW MASKS

(75) Inventors: Dong Wang, HangZhou (CN); Pingrong Yu, Santa Clara, CA (US); Xuegeng Li, Sunnyvale, CA (US)

(73) Assignee: Pu Ni Tai Neng (HangZhou) Co., Limited, Hangzhou (CN)

( * ) Notice: Subject to any disclaimer, the term of this patent is extended or adjusted under 35 U.S.C. 154(b) by 0 days.

(21) Appl. No.: 13/568,654

(22) Filed: Aug. 7, 2012

(65) Prior Publication Data

US 2014/0045293 A1 Feb. 13, 2014

(51) Int. Cl.
*H01L 27/146* (2006.01)
*H01L 31/00* (2006.01)
*H01L 31/101* (2006.01)
*H01L 29/06* (2006.01)

(52) U.S. Cl.
USPC ............. 257/435; 136/256; 136/265; 257/53; 257/462; 257/623

(58) Field of Classification Search
USPC ............ 438/68, 64, 72, 80, 83; 136/256, 262, 136/255, 265; 257/184, 419, 443, 462
See application file for complete search history.

(56) References Cited

U.S. PATENT DOCUMENTS

| | | | | |
|---|---|---|---|---|
| 3,766,419 | A * | 10/1973 | Barbin | 313/403 |
| 2001/0023702 | A1 * | 9/2001 | Nakagawa et al. | 136/244 |
| 2003/0064171 | A1 * | 4/2003 | Burrows et al. | 428/1.1 |
| 2009/0098309 | A1 * | 4/2009 | Brody et al. | 427/534 |
| 2009/0320916 | A1 * | 12/2009 | Yuan et al. | 136/256 |
| 2011/0041890 | A1 * | 2/2011 | Sheats | 136/244 |
| 2011/0146747 | A1 * | 6/2011 | Hieslmair | 136/244 |
| 2011/0174217 | A1 * | 7/2011 | Gersdorff et al. | 118/500 |

* cited by examiner

*Primary Examiner* — Khiem D Nguyen
*Assistant Examiner* — Wilner Jean Baptiste
(74) *Attorney, Agent, or Firm* — Chen Yoshimura LLP

(57) ABSTRACT

A method for fabricating thin film solar cells for a concentrated photovoltaic system uses three shadow masks. The first mask, used to deposit a back contact layer, has multiple horizontal and vertical lines defining columns and rows of cells, and multiple tabs each located in a cell along a center of a vertical border. The second mask, used to deposit a CIGS absorption layer, a window layer and a transparent contact layer, is similar to the first mask except the tabs are located along the opposite vertical border of the cells. The third mask, used to deposit a metal grid layer, has multiple bus bar openings and finger openings. Each bus bar opening is located along a horizontal center line of a cell and overlaps the second tab of a neighboring cell. The cells in a horizontal row are connected in series, forming a linear solar receiver.

13 Claims, 7 Drawing Sheets

US 8,963,270 B2

FABRICATION OF INTERCONNECTED THIN-FILM CONCENTRATOR CELLS USING SHADOW MASKS

BACKGROUND OF THE INVENTION

1. Field of the Invention

This invention relates to solar concentrating photovoltaic technology, and in particular, to a fabrication process for thin-film solar cells for a concentrating photovoltaic using shadow

2. Description of the Related Art

In conventional concentrating photovoltaic (CPV) modules, the receiving cells are typically group III-V multi-junction cells and crystalline silicon cells. These cells are used individually as receivers in point-focus CPV modules. In line-focus CPV modules, i.e., one which uses focusing optics to focus the sun light onto an area having an elongated shape with a length much greater than width, multiple cells are connected by external wires to form a linear receiver.

SUMMARY OF THE INVENTION

Thin-film solar cells, such as copper indium gallium selenide ($Cu(InGa)Se_2$, or CIGS) cells, can also be used as CPV receivers. In a line-focus CPV system, the interconnection between isolated CIGS concentrator cells to form a linear receiver is challenging because both electrical contacts of the CIGS cell are typically formed in front of the substrate. The external wiring between cells will add shadows on the cell, and/or will be exposed to concentrated light which causes safety concerns.

Embodiments of the present invention provide a process for fabrication thin-film solar cells using shadow masks. This process integrates the cell isolation and interconnection steps into the cells construction process, which avoids the concerns associated with using external wiring and reduces labor and material cost of fabrication.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides a method for fabricating thin film solar cells for a concentrated photovoltaic system, which includes:
providing a substrate; depositing a back contact layer on the substrate using a first mask, the first mask having a first plurality of parallel lines and a second plurality of parallel lines perpendicular to each other to define a plurality of open blocks corresponding to a plurality of cells, the first mask further having a plurality of first tabs each located in a block along a center of a first border of the block which is parallel to the second set plurality of parallel lines;
depositing a copper indium gallium selenium absorption layer, a window layer and a transparent contact layer using a second mask, the second mask having a first plurality of parallel lines and a second plurality of parallel lines aligned with the corresponding first plurality and second plurality of parallel lines of the first mask to define a plurality of open blocks corresponding to the blocks of the first mask, the second mask further having a plurality of second tabs each located in a block along a center of a second border of the block which is parallel to the second set of plurality of parallel lines and opposite the first border; and depositing a metal grid layer using a third mask, the third mask having a plurality of bus bar openings and a plurality of sets of finger openings, each bus bar opening being located along a center line of each block which is parallel to the first plurality of parallel lines of the first mask, and each bus bar opening at least partially overlapping the second tab of a neighboring block, each set of finger openings being located in a block and connected to the corresponding bus bar opening.

In another aspect, the present invention provides a method for fabricating thin film solar cells for a concentrated photovoltaic system, which includes: providing a substrate; depositing a back contact layer on the substrate using a first mask, the first mask having a plurality of vertical lines and a plurality of first tabs joined to the vertical lines on one side and located at a first plurality of vertical locations spaced equally from each other; depositing a copper indium gallium selenium absorption layer, a window layer and a transparent contact layer using a second mask, the second mask having a plurality of vertical lines aligned with the corresponding plurality of parallel lines of the first mask and a plurality of second tabs joined to the vertical lines on an opposite side and located at the first plurality of vertical locations; scribing the back contact layer, the copper indium gallium selenium absorption layer, the window layer and the transparent contact layer along a plurality of horizontal lines located at a plurality of second vertical locations halfway between the first plurality of vertical locations; and depositing a metal grid layer using a third mask, the third mask having a plurality of bus bar openings and a plurality of sets of finger openings, each bus bar opening being located along a center line of each block which is parallel to the plurality of parallel lines of the first mask, and each bus bar opening at least partially overlapping one second tab, each set of finger openings being connected to a bus bar opening.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
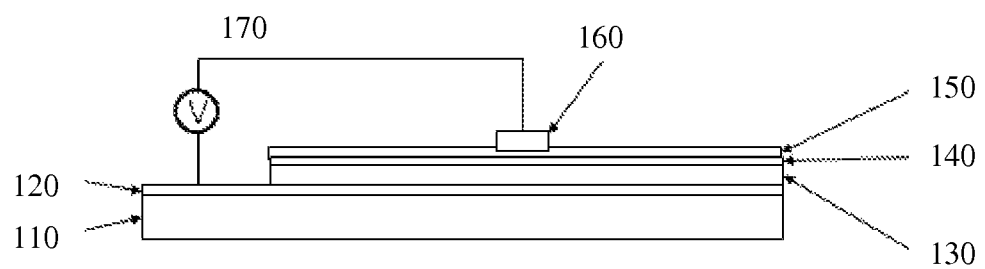
FIG. 1 schematically illustrates the structure of a CIGS thin film solar cell.

A typical CIGS cell structure is illustrated in FIG. 1. On a substrate 110, a back contact layer 120 (usually molybdenum), a CIGS absorber layer 130, a window layer 140, a transparent front contact layer 150 (e.g., transparent conductive oxide, TCO), and a metal grid structure 160 are deposited sequentially. The photocurrent generated by the cells is collected by the metal grid structure 160, flows to external circuit load 170, and then flows back to the back contact layer 120.

According to embodiments of the present invention, a thin film solar cell fabrication process uses three shadow masks during depositions of the various materials. The depositions may employ a process such as sputtering.

Figure 2A:
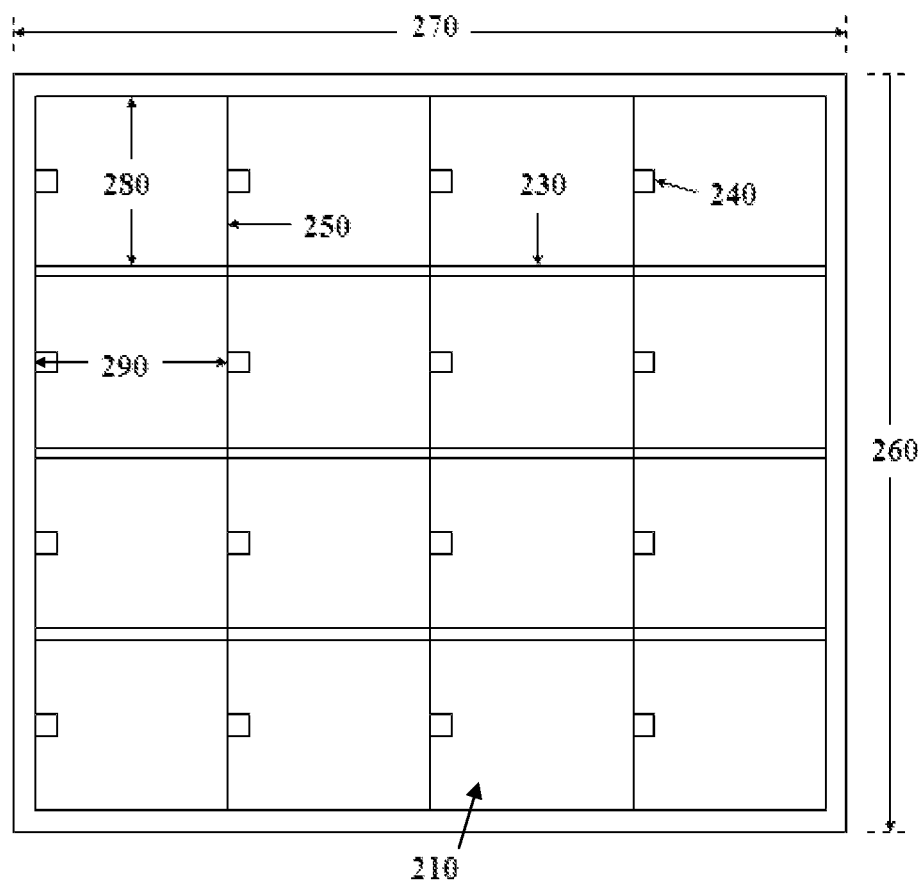
FIGS. 2A and 2B schematically illustrate two shadow masks useful for depositing the back contact layer of the thin film solar cells according to embodiments of the present invention.

In order to form multiple electrically isolated cells on the same substrate, the back contact layer 120 must be patterned. The first masks shown in FIG. 2A can be used during back contact layer deposition for patterning purposes. The mask 210 covers a substrate having a length 270 and a width 260. The horizontal lines 230 of the mask divide the substrate area into multiple rows. The number of rows is determined by the width 280 of each row, the width of mask lines 230, and the substrate width 260. Each row may eventually form a linear receiver for a CPV system that includes interconnected solar cells. The mask 210 also contains vertical lines 250, which are perpendicular to the horizontal lines 230 and divide the substrate area into multiple columns. Therefore, lines 230 and 250 define multiple open blocks of the mask. Each block corresponds to the area of a solar cell. The number of columns, i.e. the number of cells on each row, is determined by the length 290 of each cell, the width of mask lines 250, and the substrate length 270. The mask also includes a plurality of small tabs 240, one for each block, located along one vertical side edge of the block (the left hand side in this example) and near the center in the vertical direction along that edge. The tabs are rectangular or square shaped in the illustrated example, and are joined to the vertical mask lines 250.

After deposition of the back contact layer on the substrate using the mask 210, there is no back contact material in the areas covered by lines 230 and 250 and tabs 240. The width of the vertical lines 250 determines the distance between cells of the same linear receiver (row). This distance should be minimized since the area between the cells will be illuminated by the concentrated sub light but will not contribute to generating photocurrent. To minimize the distance between cells, an alternative first mask 220 shown in FIG. 2B may be used in lieu of the mask 210 for depositing the back contact layer 120. The mask 220 does not have the horizontal lines 230. The tabs 240 are located along one vertical side edge of the block and near the center in the vertical direction along that edge. The tabs are rectangular or square shaped in the illustrated example, and are joined to the vertical mask lines 250. After deposition, laser scribing or mechanical scribing is applied at locations indicated by the dashed lines to remove the back contact material in narrow areas between the cells to separate the cells of different rows. The locations of the dashed lines correspond to the locations of the horizontal lines 230 in the mask 210, but it should be understood that these lines do not actually exist in the mask 220. The width of the scribed lines can be on the micro-meter scale, so that negligible dead areas between adjacent cells are generated.

Yet another way of patterning the back contact layer 120 is by using photolithography. However, photolithography also requires the use of mask and requires additional material and time.

Figure 3A:
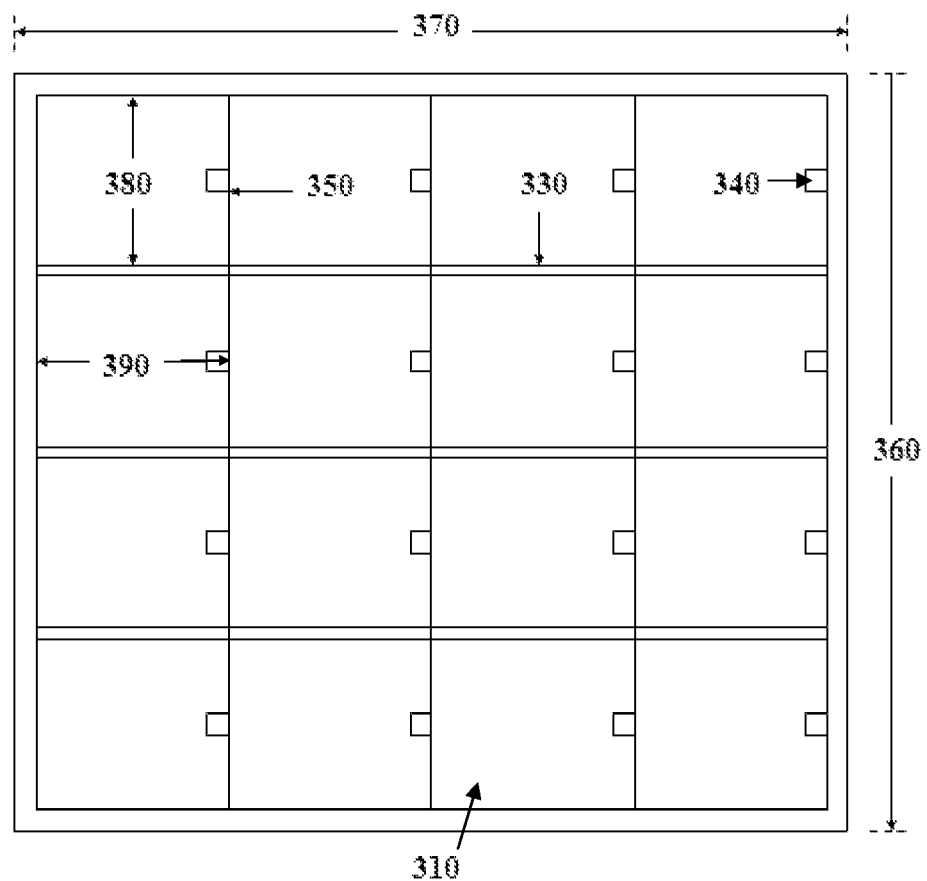
FIGS. 3A and 3B schematically illustrate two shadow masks useful for depositing the CIGS layer, the window layer, and the front contact layer of the thin film solar cells according to embodiments of the present invention.
Figure 3B:
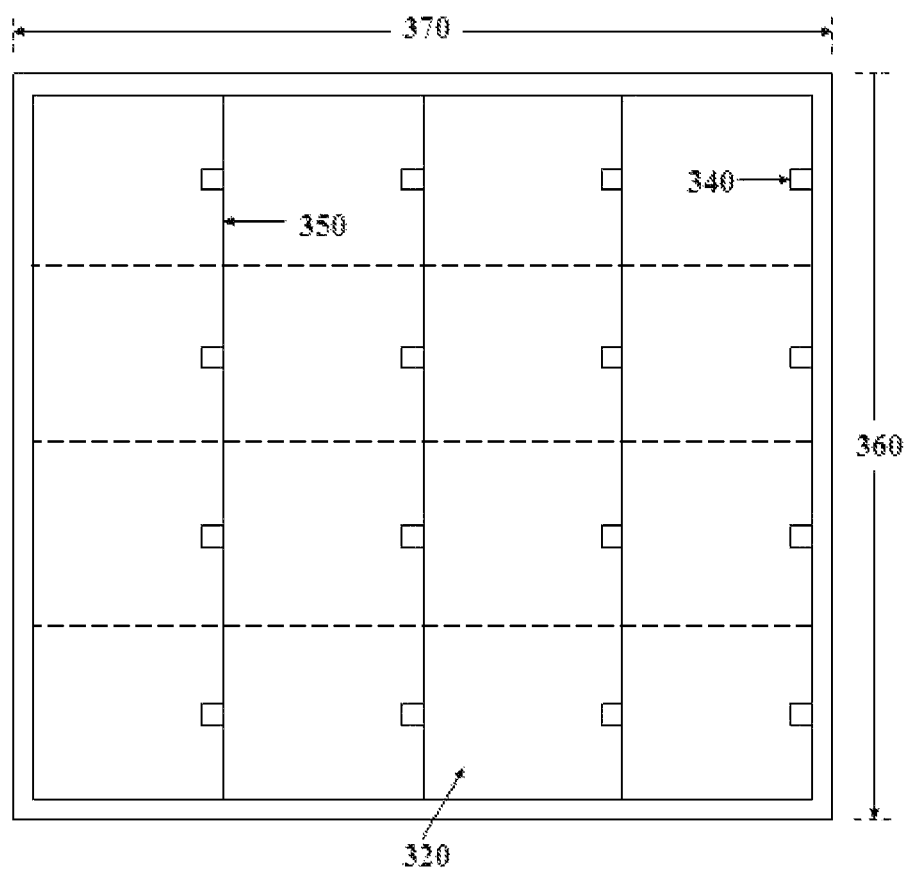

During deposition of the CIGS layer 130, the window layer 140, and the front contact layer 150, a second mask shown in FIGS. 3A or 3B is used. The masks 310 shown in FIG. 3A is similar to the mask 210 shown in FIG. 2A, except that the tabs 340 are located on the opposite edge of each block (the right hand side in this example). In other words, the shape of each cell area is a minor image of that of the mask 210. The horizontal lines 330 and vertical lines 350 are similar to the lines 230 and 250 of the mask 210, and the second mask is positioned such that the horizontal lines and vertical lines 330 and 350 are aligned with the corresponding horizontal lines and vertical lines 230 and 250 of the mask 210. The substrate length and width are the same as those of FIG. 2A and are indicated by symbols 370 and 360. Alternatively, a mask 320 shown in FIG. 3B may be used in this step. The mask 320 is similar to the mask 310 of FIG. 3A but the horizontal lines 330 are omitted. If the mask 320 is used, a laser or mechanical scribing step is applied after deposition at locations indicated by the dashed lines to separate the cells of different rows. The locations of the dashed lines correspond to the locations of the horizontal lines 330 in the mask 310, but it should be understood that these lines do not actually exist in the mask 320.

Figure 2B:
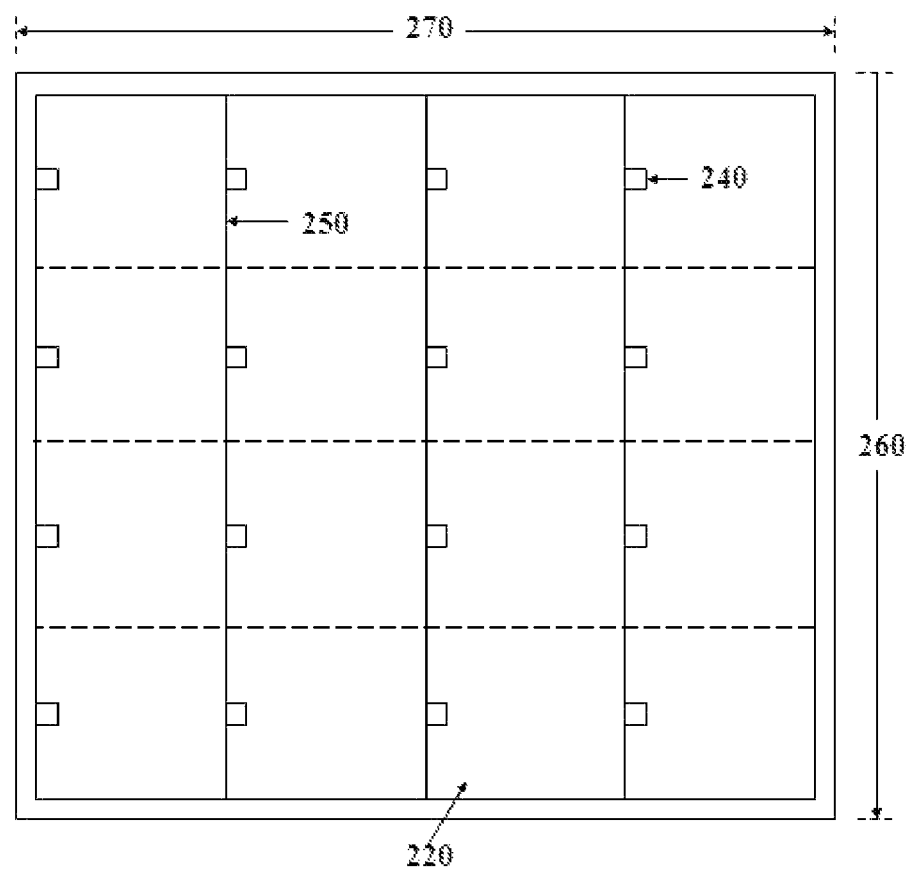

As an alternative, if the mask 220 is used to deposit the back contact layer 120 and the mask 320 is used to deposit the CIGS layer 130, the window layer 140, and the front contact layer 150, a single scribing step may be applied after deposition of the front contact layer 150 to remove layers 120, 130, 140 and 150 along the dashed lines of FIGS. 2B, 3B to separate the cells in different rows.

It should be understood that when the horizontal and vertical lines of the second mask are said to be aligned with the corresponding horizontal and vertical lines of the first mask (both in the specification and in the claims), it does not mean that the first and second masks are present simultaneously on the substrate. Rather, it means that the locations of the horizontal and vertical lines of the second mask are aligned with the locations of the horizontal and vertical lines of the first mask, as they are both measured relative to the substrate. The same is true in later descriptions that refer to the alignment of the third mask.

Figure 4A:
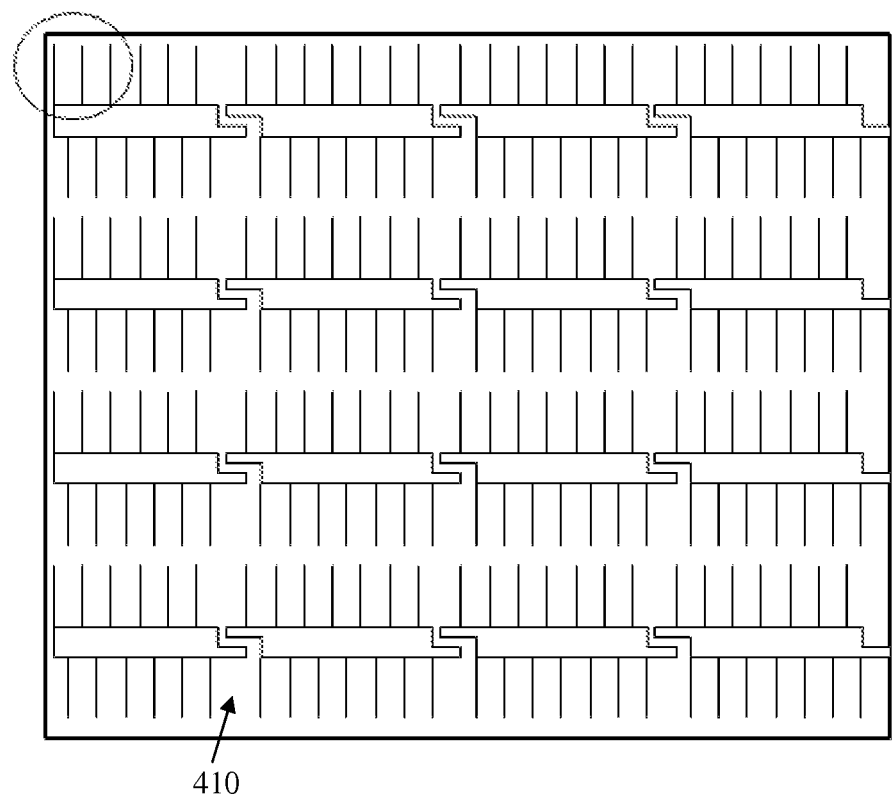
FIG. 4A schematically illustrates a shadow mask useful for depositing the metal grid of the thin film solar cells according to embodiments of the present invention.
Figure 4B:
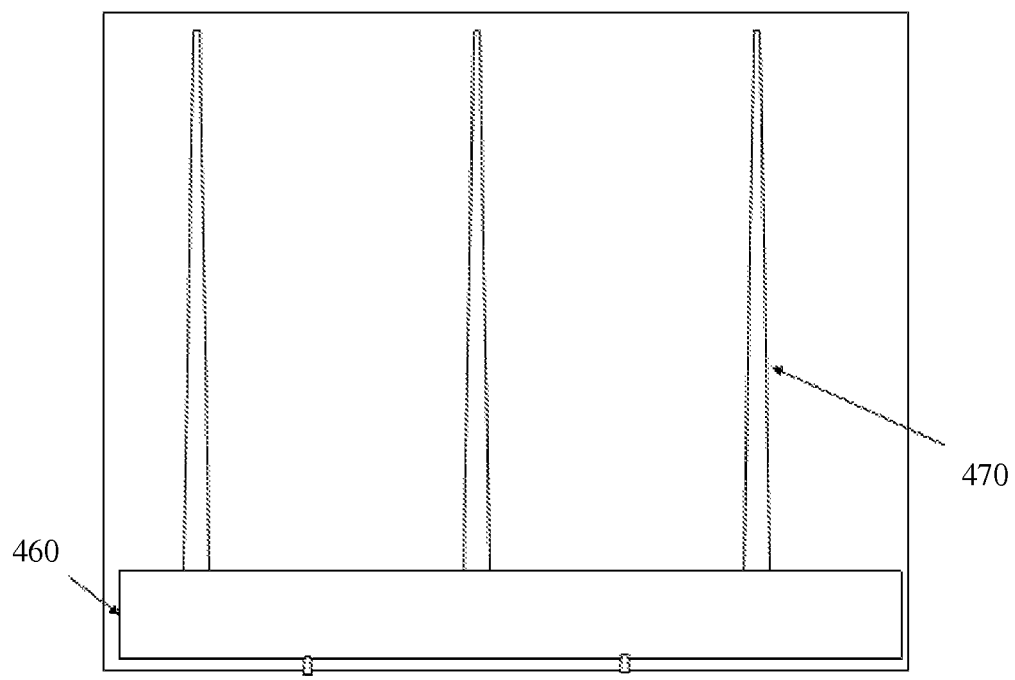
FIG. 4B is an enlarged view of a portion of the mask in FIG. 4A.

FIGS. 4A and 4B show a third mask 410 used for the metal grid deposition step. FIG. 4A shows the entire mask, and FIG. 4B is an enlarged view of a corner portion of the mask. The mask 410 has multiple bus bar openings 460 and finger openings 470, for forming the bus bars and fingers of the metal grid pattern. For each cell, the bus bar opening 460 is located horizontally along a horizontal center line of the cell, at least partially overlapping the locations of tabs 340 of the neighboring cells. The finger openings 470 extend from the bus bar opening 460 and are distributed in the rest of the cell. The fingers of the grid pattern conduct photocurrent from the front contact layer 150 to the bus bar. The width of the bus bars should be as small as possible to reduce the light block; another consideration in the dimension of bus bars (thickness and area) is that the resistive lost of the photocurrent on bus bars should be negligible.

Since the fingers are within the illuminated area of the solar module, the size of fingers should be minimized to reduce shadowing loss. In the other hand, the width of the fingers should be large enough to prevent significant resistive loss when photocurrent flows through the fingers. This trade-off requires the configuration of the fingers—their dimensions, spacing, and material—to be carefully designed by taking into consideration of the size of the cell, the light concentration factor, the sheet resistance of the front contact layer, etc.

While many different configurations of the fingers are possible, good designs share some common features. For example, as shown in FIG. 4B, the finger openings 470 have a tapered shape, i.e., their widths are smaller at the distal end and larger at the proximate end. The photocurrent accumulates when flowing through the fingers to the bus bars. To match the gradually increased current, the tapered finger has gradually lowered resistance when the current flows closer to the bus bar. This results in lower resistive loss of the photocurrent than a design that uses fingers with the same overall area but a constant width.

Compared with ink-jet printing, the use of shadow masks for depositing the metal grid structure avoids the subsequent high temperature annealing process which may damage the solar cells. The advantage of using shadow masks over photolithography for depositing the metal grid structure is that there is no limit on the grid thickness and no interference from the developer with the front contact layer.

Figure 5:
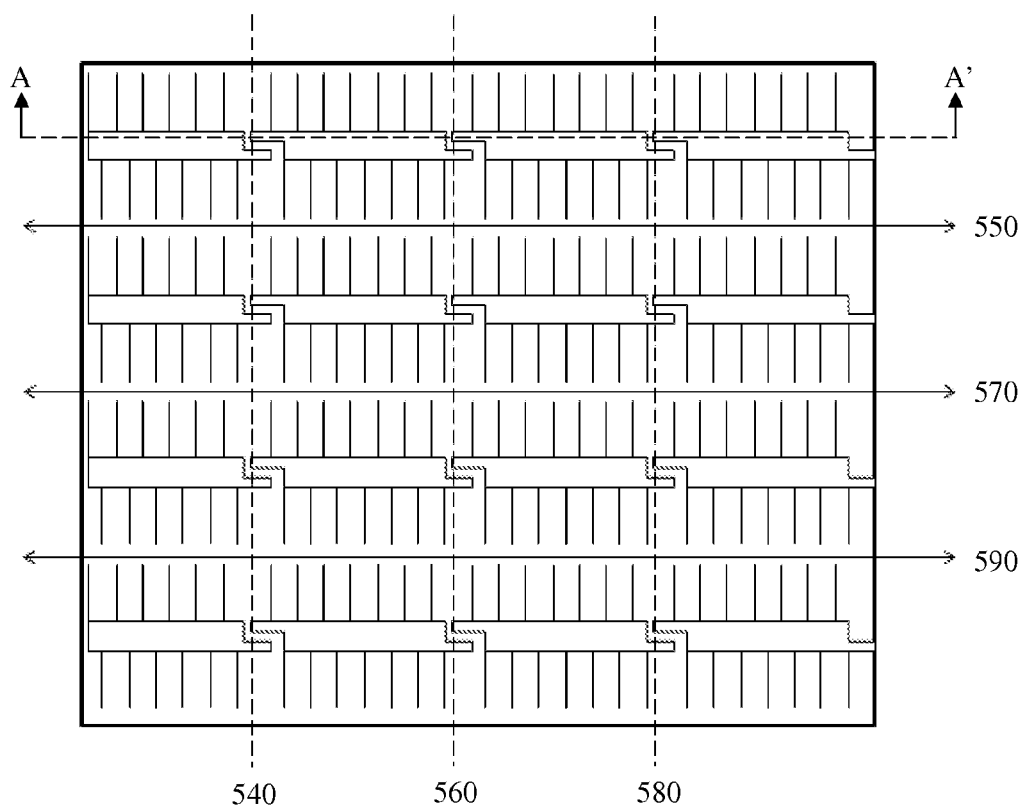
FIG. 5 schematically illustrates a top view of the interconnected thin film solar cells.

FIG. 5 is a top view of the substrate after metal grid deposition. After mechanical or laser cutting along the lines 550, 570, and 590, each row becomes a linear receiver with multiple solar cells interconnected in series. The dotted lines 540, 560, and 580 indicate where the cells are isolated within each row. The isolation is the result of using bars 250 and bars 350 of the first and second masks.

Figure 6:
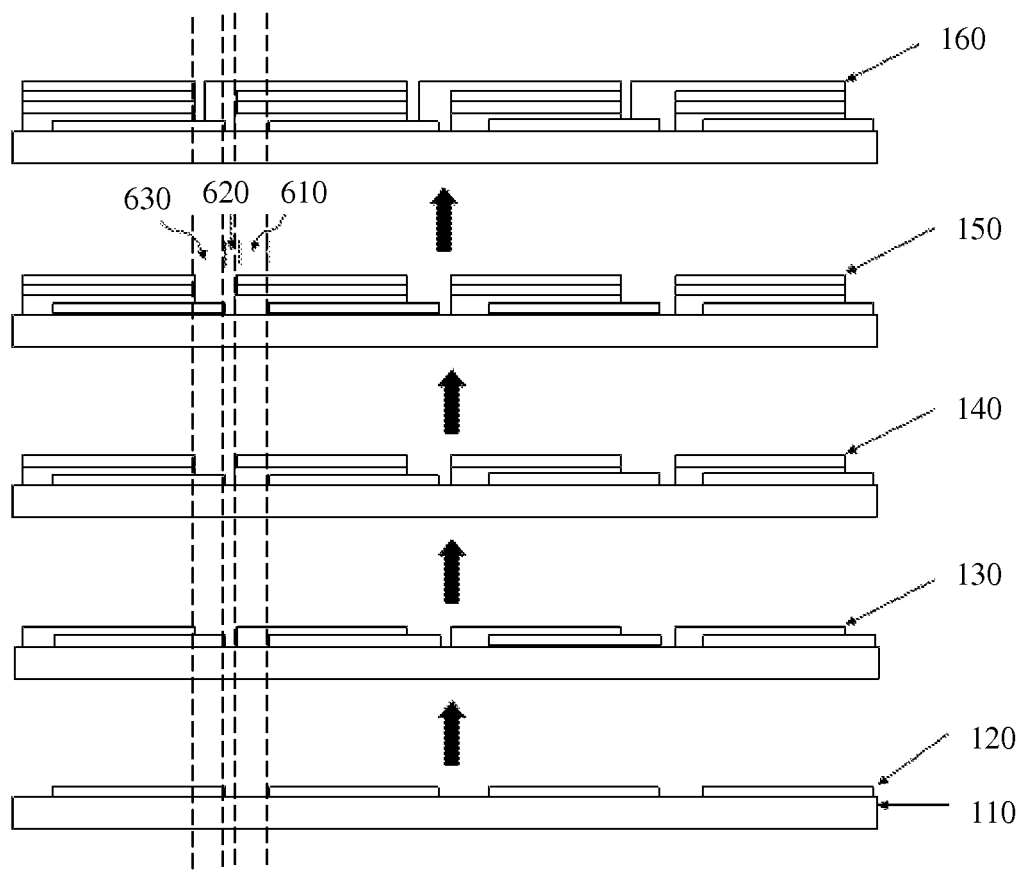
FIG. 6 is a cross sectional view illustrating the thin film solar cells during the fabrication process according to embodiments of the present invention.

FIG. 6 shows the cross-section view of the thin film solar cells along the line A-A' of FIG. 5. After deposition of the back contact layer 120 using the first mask 210 or 220, in regions 610, the back contact material is missing due to the tabs 240 of the first mask. After deposition of the CIGS absorber layer 130, the window layer 140, and the front contact layer 150 using the second mask 310 or 320, in regions 630, only the naked back contact layer is present due to the tabs 340 on the second mask. In the regions 620 which are sandwiched between regions 610 and 630, there is no material existing due to the bars 250 and 350 of the first and second masks. After the grid 160 is deposited using the third mask 410, the naked back contact layer in region 630 of one cell is electrically connected to the front contact layer 150 of its neighboring cell by the grid material 160. As a result, all cells on the same row are electrically connected in series.

The substrate 110 may be either an insulating substrate or an electrically conductive substrate coated with a dielectric layer.

It will be apparent to those skilled in the art that various modification and variations can be made in the fabrication process for thin-film solar cells of the present invention without departing from the spirit or scope of the invention. Thus, it is intended that the present invention cover modifications and variations that come within the scope of the appended claims and their equivalents.

What is claimed is:

1. A set of shadow masks used for fabrication of interconnected thin film solar cells for a concentrated photovoltaic system, the concentrated photovoltaic system comprising a substrate, a back contact layer, a copper indium gallium selenide absorption layer, a buffer layer, a transparent conductive layer, and metal gate lines, the set of shadow masks comprising:

a first mask, used for depositing the back contact layer on the substrate, the first mask having a first plurality of parallel lines and a second plurality of parallel lines perpendicular to each other to define a plurality of open blocks corresponding to a plurality of cells, the first mask further having a plurality of first tabs each located in a block along a center of a first border of the block which is parallel to the second plurality of parallel lines;

a second mask, used for depositing the copper indium gallium selenide absorption layer, the buffer layer and the transparent conductive layer on the back contact layer, the second mask having a first plurality of parallel lines and a second plurality of parallel lines aligned with the corresponding first plurality and second plurality of parallel lines of the first mask to define a plurality of open blocks corresponding to the blocks of the first mask, the second mask further having a plurality of second tabs each located in a block along a center of a second border of the block which is parallel to the second plurality of parallel lines and opposite the first border; and a third mask, used for depositing the metal gate lines, the third mask having a plurality of bus bar openings and a plurality of sets of finger openings, each bus bar opening being located along a center line of each block which is parallel to the first plurality of parallel lines of the first mask, and each bus bar opening at least partially overlapping the second tab of a neighboring block, each set of finger openings being located in a block and connected to the corresponding bus bar opening.

2. The set of shadow masks of claim 1, wherein a number of the second parallel lines in the first mask depend on a length of the cells, a width of the second parallel lines and a length of the substrate.

3. The set of shadow masks of claim 1, wherein a number of the first parallel lines in the first mask depend on a width of the cells, a width of the first parallel lines and a width of the substrate.

4. The set of shadow masks of claim 1, wherein a number of the first parallel lines and a number of the second parallel lines in the second mask are equal to the numbers of the first and second parallel lines, respectively, in the first mask.

5. The set of shadow masks of claim 1, wherein the fingers in the third mask have a tapered shape.

6. The set of shadow masks of claim 1, wherein the first mask, the second mask and the third mask have equal length and equal width.

7. The set of shadow masks of claim 1, wherein the tabs in the first and second mask have a rectangular or square shape.

8. A set of shadow masks used for fabrication of interconnected thin film solar cells for a concentrated photovoltaic system, the concentrated photovoltaic system comprising a substrate, a back contact layer, a copper indium gallium selenide absorption layer, a buffer layer, a transparent conductive layer, and metal gate lines, the set of shadow masks comprising:

a first mask, used for depositing the back contact layer on the substrate, the first mask having a plurality of vertical lines and a plurality of first tabs joined to the vertical lines on one side and located at a first plurality of vertical locations spaced equally from each other;

a second mask, used for depositing the copper indium gallium selenide absorption layer, the buffer layer and the transparent conductive layer on the back contact layer, the second mask having a plurality of vertical lines aligned with the corresponding plurality of vertical lines of the first mask and a plurality of second tabs joined to the vertical lines on an opposite side and located at the first plurality of vertical locations; and a third mask, used for depositing the metal gate lines, the third mask having a plurality of bus bar openings and a plurality of sets of finger openings, each bus bar opening being located along a center line of each block which is parallel to the plurality of parallel lines of the first mask, and each bus bar opening at least partially overlapping one second tab, each set of finger openings being connected to a bus bar opening.

9. The set of shadow masks of claim 8, wherein a number of the vertical lines in the first mask depend on a length of the cells, a width of the vertical lines and a length of the substrate.

10. The set of shadow masks of claim 8, wherein a number of vertical lines in the second mask is equal to the number of the vertical lines in the first mask.

11. The set of shadow masks of claim 8, wherein the fingers in the third mask have a tapered shape.

12. The set of shadow masks of claim 8, wherein the first mask, the second mask and the third mask have equal length and equal width.

13. The set of shadow masks of claim 8, wherein the tabs in the first and second mask have a rectangular or square shape.

* * * * *